(12) United States Patent
Narawade et al.

(10) Patent No.: US 10,965,278 B1
(45) Date of Patent: Mar. 30, 2021

(54) CROSS-COUPLED HIGH-SPEED, LOW POWER LEVEL SHIFTER

(71) Applicant: SiFive, Inc., San Mateo, CA (US)

(72) Inventors: Santosh Mahadeo Narawade, Bangalore (IN); Jithin K, Bangalore (IN); Mohit Gupta, San Jose, CA (US)

(73) Assignee: SiFive, Inc., San Mateo, CA (US)

( * ) Notice: Subject to any disclaimer, the term of this patent is extended or adjusted under 35 U.S.C. 154(b) by 0 days.

(21) Appl. No.: 16/827,963

(22) Filed: Mar. 24, 2020

(51) Int. Cl.
*H03K 3/356* (2006.01)
*H03K 19/0185* (2006.01)

(52) U.S. Cl.
CPC . *H03K 3/356113* (2013.01); *H03K 3/356182* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 5,528,173 A | 6/1996 | Merritt et al. | |
| 6,963,226 B2 | 11/2005 | Chiang | |
| 8,610,462 B1* | 12/2013 | Wang | H03K 3/356113 326/68 |
| 2006/0066380 A1* | 3/2006 | Nomura | H03K 19/018521 327/333 |
| 2009/0002027 A1* | 1/2009 | Lee | H03K 3/356113 326/80 |
| 2011/0001538 A1 | 1/2011 | Alam | |
| 2011/0303988 A1* | 12/2011 | Dono | H03K 3/356182 257/379 |

* cited by examiner

*Primary Examiner* — Amy Cohen Johnson
*Assistant Examiner* — James H Cho
(74) *Attorney, Agent, or Firm* — Young Basile Hanlon & MacFarlane, P.C.

(57) ABSTRACT

Described is a high speed, low power level shifter circuit which includes a cross-coupled level shifter coupled to a sensing circuit. The sensing circuit turns off a cross-coupled node of a pair of cross-coupled nodes based on detecting that an input voltage has crossed a threshold voltage for a cross-coupled input transistor of a pair of cross-coupled input transistors, i.e. due to switching from a current logic level to an incoming logic level. Once the sensing circuit detects a threshold voltage crossing, a pull-up circuit pulls high a cross-coupled node and cross-coupled source transistor tied to the cross-coupled node. This turns off the cross-coupled source transistor and turns on another cross-coupled source transistor. Two parallel paths are now established to pull the cross-coupled node high, enabling a high-speed transition. The turning off of the cross-coupled source transistor also pulls the output to the incoming logic level.

19 Claims, 4 Drawing Sheets

US 10,965,278 B1

CROSS-COUPLED HIGH-SPEED, LOW POWER LEVEL SHIFTER

TECHNICAL FIELD

This disclosure relates to level shifters and in particular, cross-coupled high-speed, low power level shifters.

BACKGROUND

Input/output (I/O) circuits need to achieve I/O speeds from 1 Gbps to 50 Gbps at lower and lower fabrication sizes with increasingly lower supply voltages. Level shifters shift the voltage level of a logic signal from one operating voltage to another operating voltage and are used as front-end circuits for other circuits and devices such as the I/O circuits, drivers, and the like. Although operable at low power, conventional level shifters fail to address the high-speed requirements of the I/O circuits. The conventional level shifters suffer from skew, delay, and rise and fall mismatches due to their use of cross coupled transistors and associated legs which require one leg to settle before triggering the other leg. Duty cycle is particularly bad during skewed corners where a p-type metal-oxide-semiconductor (PMOS) remains in a fast process corner and a n-type metal-oxide-semiconductor (NMOS) remains in a slow process corner. High-speed operability is impractical due to the multi-voltage nature of the conventional level shifters. These issues become increasingly problematic as the voltage gap widens between core and I/O circuits.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
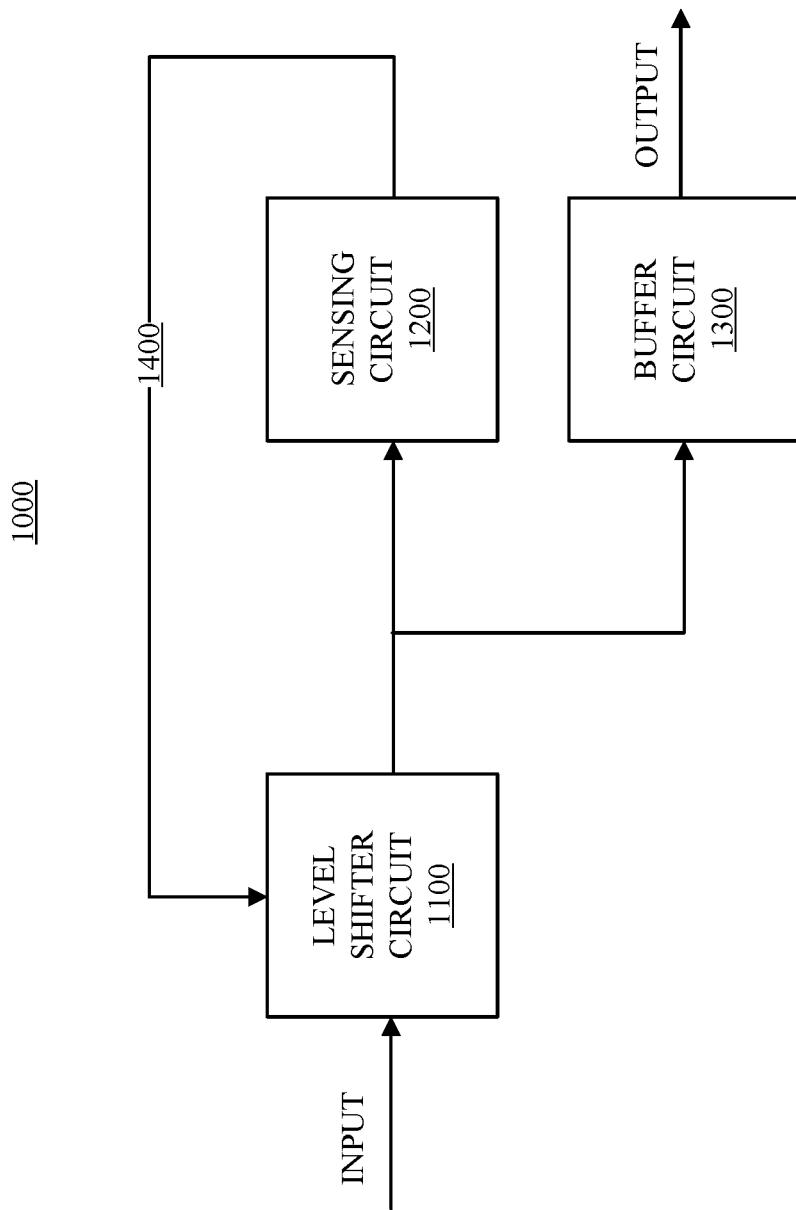
FIG. 1 is a block diagram of an example of a cross-coupled high-speed, low power level shifter circuit in accordance with embodiments of this disclosure.

Disclosed herein are circuits, systems and methods for a cross-coupled high-speed, low power level shifter. The cross-coupled high speed, low power level shifter circuit includes a cross-coupled level shifter coupled to a sensing circuit. The sensing circuit pre-charges a high impedance node of one cross-coupled leg of a pair of cross-coupled legs based on detecting that an input voltage has crossed a threshold voltage for one cross-coupled input transistor of a pair of cross-coupled input transistors, i.e., due to switching from a current logic level to an incoming logic level. The high impedance node is one of the cross-coupled nodes from a pair of cross-coupled nodes connected to the pair of cross-coupled legs. Once the sensing circuit detects a crossing of the threshold voltage, a pull-up circuit pulls high the high impedance node and cross-coupled source transistor tied to the cross-coupled leg, eventually turning off the cross-coupled source transistor and turning on another cross-coupled source transistor. Two parallel paths are now established to pull the cross-coupled node high, enabling a high-speed transition. The turning off of the cross-coupled source transistor also pulls the output to the incoming logic level.

In implementations, initial conditions for a pair of cross-coupled nodes determines which sensing circuit of a pair of sensing circuits is actively pulling high one cross-coupled node of a pair of cross-coupled nodes i.e., the high impedance node. The additional current from the appropriate sensing circuit lessens the work required by an associated cross-coupled input transistor during transition events and permits high-speed operability.

These and other aspects of the present disclosure are disclosed in the following detailed description, the appended claims, and the accompanying figures.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

The term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function. For example, the processor can be a circuit. For example, the processor can be a circuit.

As used herein, the terminology "determine" and "identify," or any variations thereof, includes selecting, ascertaining, computing, looking up, receiving, determining, establishing, obtaining, or otherwise identifying or determining in any manner whatsoever using one or more of the devices and methods shown and described herein.

As used herein, the terminology "example," "embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is, unless specified otherwise, or clear from context, "X includes A or B" is intended to indicate any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

It is to be understood that the figures and descriptions of embodiments have been simplified to illustrate elements that are relevant for a clear understanding, while eliminating, for the purpose of clarity, many other elements found in typical processors. Those of ordinary skill in the art may recognize that other elements and/or steps are desirable and/or required in implementing the present disclosure. However, because such elements and steps do not facilitate a better understanding of the present disclosure, a discussion of such elements and steps is not provided herein.

FIG. 1 is a block diagram of an example of a high-speed, low power level shifter circuit 1000 in accordance with embodiments of this disclosure. In implementations, the high-speed, low power level shifter circuit 1000 includes a level shifter circuit 1100 which is connected to or in communication with (collectively "connected to") to a sensing circuit 1200 and a buffer circuit 1300. In implementations, the buffer circuit 1300 mitigates the impact of the output load on the sensing circuit 1200. In implementations, the level shifter circuit 1100 is a cross-coupled transistor circuit with a pair of cross-couple legs cross-coupling the transistors. The sensing circuit 1200 is further connected to the level shifter circuit 1100 via a feedback loop 1400. The high-speed, low power level shifter circuit 1000 and each element or component in the high-speed, low power level shifter circuit 1000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

Operationally, the high-speed, low power level shifter circuit 1000 receives an input signal having a defined voltage level and outputs an output signal with a different defined voltage to other circuits, devices, or combinations thereof via the buffer circuit 1300. In implementations, the input signal is a high-speed input signal. In implementations, the input signal can have a speed in the range of 1 Gbps to 50 Gbps. The input signal can transition from a high logic signal to a low logic signal or from a low logic signal to a high logic signal. Consequently, the level shifter circuit 1100 has two sets of initial conditions, one set of initial conditions for when the transition is from the high logic signal to the low logic signal, and another set of initial conditions for when the transition is from the low logic signal to the high logic signal.

Conventional cross-coupled transistor circuits are slow to overcome either set of initial conditions due to the inherent nature of the cross-coupled architecture. For each set of initial conditions, there is a struggle between different nodes in the cross-coupled architecture to switch transistors on and off and switch the current logic signal to an incoming logic signal. High-speed operability suffers as there is a settling time associated with the cross-coupled transistors, cross-coupled nodes, and the cross-coupled legs. In particular, one of the cross-coupled nodes is a high impedance node due to the cross-coupled architecture. The sensing circuit 1200 mitigates or overcomes the settling time by sensing the input signal at an input transistor. The sensing circuit 1200 supplies current to the cross-coupling node which is the high impedance node and turns off a cross-coupled transistor tied to the cross-coupling node. This also blocks a transient current path during the transition. The other cross-coupled transistor is turned on, which establishes a second current path to the cross-coupled leg. Consequently, high-speed transitions are operable.

Figure 2:
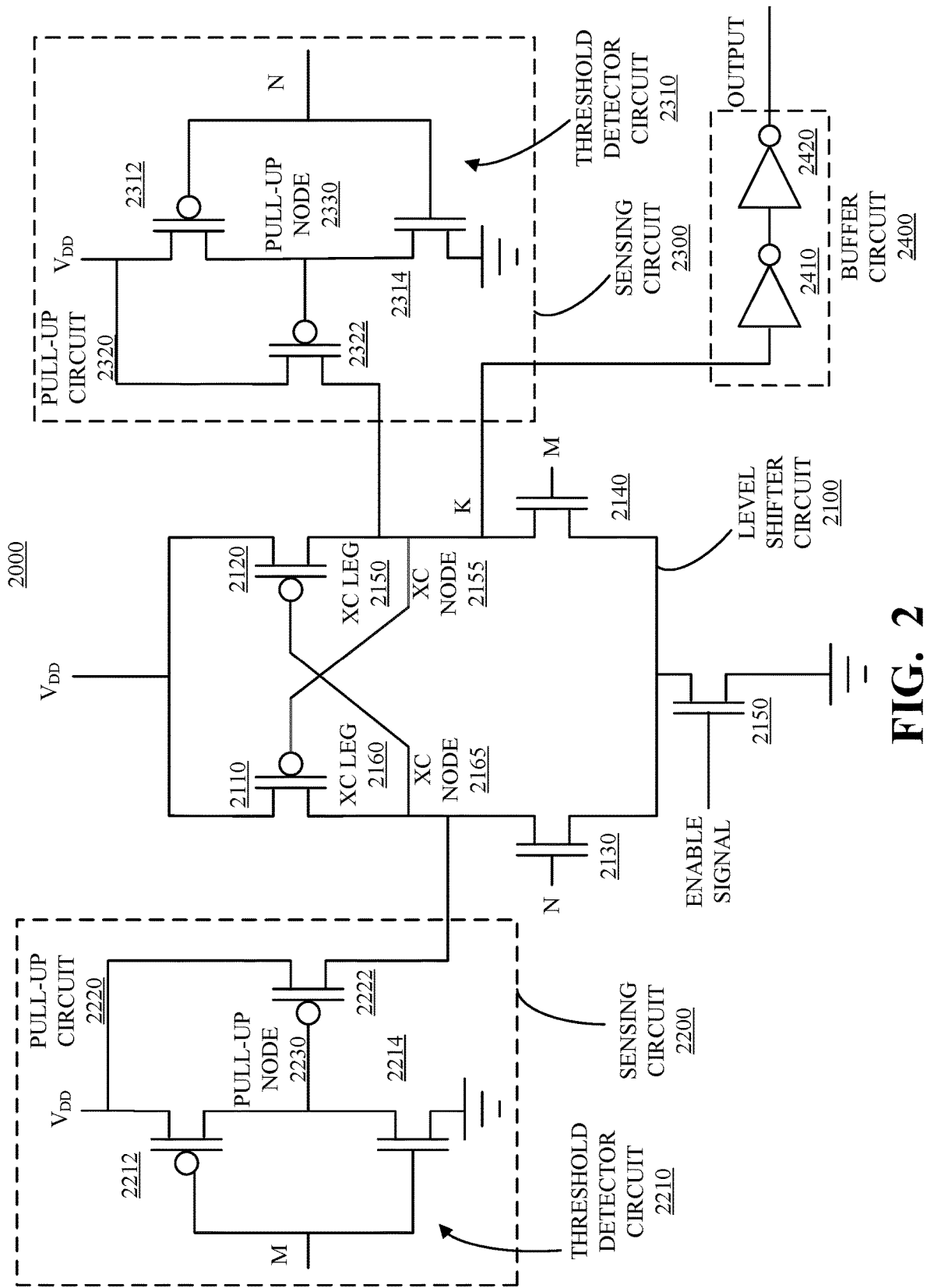
FIG. 2 is a block diagram of an example of a cross-coupled high-speed, low power level shifter circuit in accordance with embodiments of this disclosure.

FIG. 2 is a block diagram of an example of a high-speed, low power level shifter circuit 2000 in accordance with embodiments of this disclosure. The high-speed, low power level shifter circuit 2000 includes a level shifter circuit 2100 connected to a pair of sensing circuits 2200 and 2300, and a buffer circuit 2400. The high-speed, low power level shifter circuit 2000 and each element or component in the high-speed, low power level shifter circuit 2000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

The level shifter circuit 2100 includes a pair of cross-coupled source or load transistors 2110 and 2120 which each have sources tied to voltage supply ($V_{DD}$). In implementations, the pair of cross-coupled source or load transistors 2110 and 2120 are PMOS transistors. The level shifter circuit 2100 includes a pair of cross-coupled input transistors 2130 and 2140 which each have sources connected to ground and an enable signal via a transistor 2150. In implementations, the pair of cross-coupled input transistors 2130 and 2140 and the transistor 2150 are NMOS transistors. The high-speed, low power level shifter circuit 2000 is operational when the enable signal is enabled. The drains of the pair of the cross-coupled source transistors 2110 and 2120 are coupled to the drains of the pair of cross-coupled input transistors 2130 and 2140, respectively. The gates of the pair of the cross-coupled source transistors 2110 and 2120 are cross-coupled to the drains of the pair of cross-coupled input transistors 2140 and 2130, respectively, forming a cross-couple leg (XC LEG) 2150 having a cross-couple node (XC NODE) 2155 and a XC LEG 2160 having a XC NODE 2165.

The sensing circuit 2200 is connected at the XC NODE 2165 and includes a threshold detector circuit 2210 connected to a pull-up circuit 2220. The threshold detector 2210 includes a PMOS transistor 2212 having a source connected to $V_{DD}$ and a drain connected to a drain of a NMOS transistor 2214, which has a source connected to ground. The pull-up circuit 2220 includes a PMOS transistor 2222 having a gate connected to the drain of the PMOS transistor 2212 and the drain of the NMOS transistor 2214 at a pull-up node 2230, a source connected to $V_{DD}$, and a drain connected to the XC NODE 2165. The implementation of the threshold detector circuit 2210 and the pull-up circuit 2220 are illustrative and other circuits can be used which are within the scope of the specification and claims The sensing circuit 2300 is connected at the XC NODE 2155 and includes a threshold detector circuit 2310 connected to a pull-up circuit 2320. The threshold detector 2310 includes a PMOS transistor 2312 having a source connected to $V_{DD}$ and a drain connected to a drain of a NMOS transistor 2314, which has a source connected to ground. The pull-up circuit 2320 includes a PMOS transistor 2322 having a gate connected to the drain of the PMOS transistor 2312 and the drain of the NMOS transistor 2314 at a pull-up node 2330, a source connected to $V_{DD}$, and a drain connected to the XC NODE 2155. The implementation of the threshold detector circuit 2310 and the pull-up circuit 2320 are illustrative and other circuits can be used which are within the scope of the specification and claims The buffer circuit 2400 includes a pair of serially connected inverters 2410 and 2420. An output (K) of the level shifter circuit 2100 is connected to an input of the inverter 2410 and an output of the inverter 2420 is an output of the buffer circuit 2400.

Figure 3:
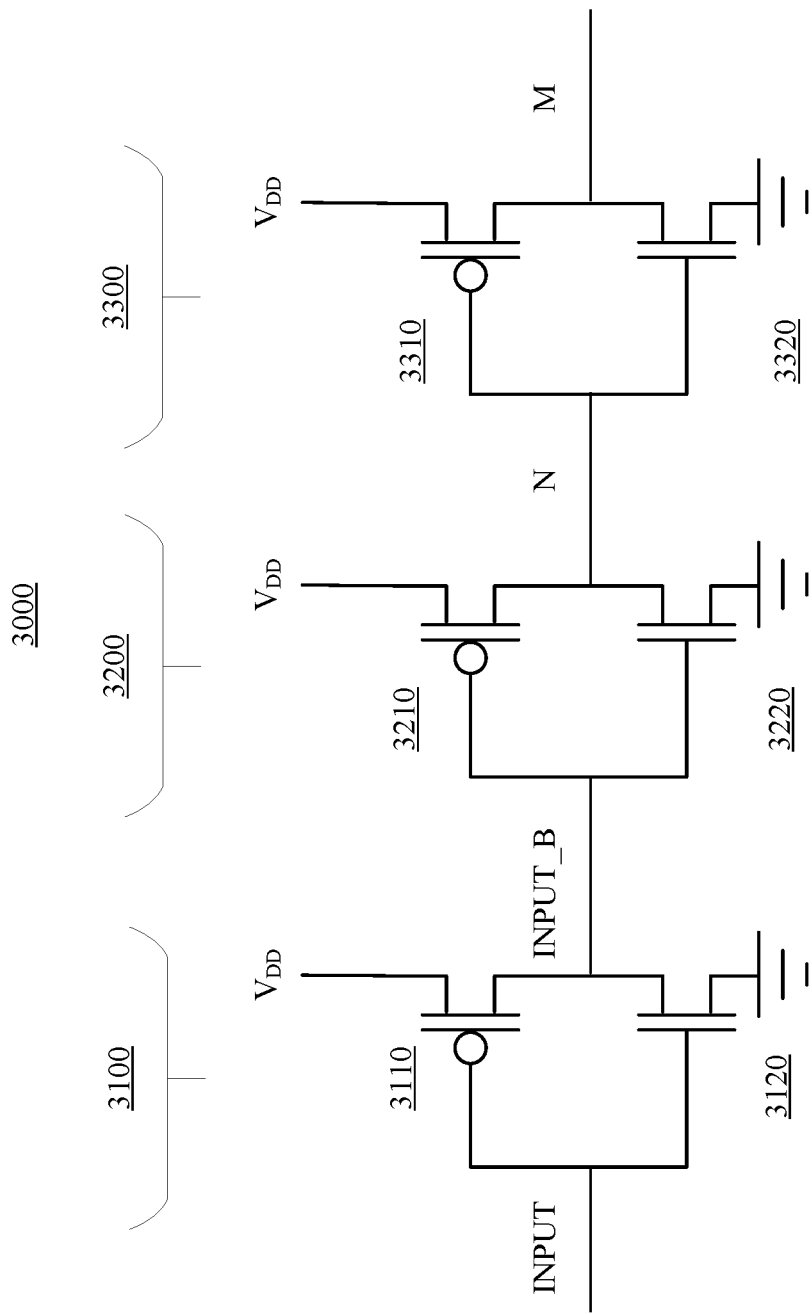
FIG. 3 is a block diagram of an example of an input generation circuit for the cross-coupled high-speed, low power level shifter circuits of FIG. 1 and FIG. 2 in accordance with embodiments of this disclosure.

FIG. 3 is a block diagram of an example of an input generation circuit 3000 for the high-speed, low power level shifter circuits of FIG. 1 and FIG. 2 in accordance with embodiments of this disclosure. The input generation circuit 3000 includes a first stage 3100 receiving an input (INPUT) and outputting a complementary input (INPUT_B). The first stage 3100 is connected to a second stage 3200. The INPUT is the input for the high-speed, low power level shifter circuit 2000, for example. The second stage 3200 receiving the INPUT_B and outputting a following input N. The second stage 3200 is connected to a third stage 3300. The third stage 3300 receiving the following input N and outputting a complementary input M. The following input N is connected to the gates of the cross-coupled input transistor 2130, the PMOS transistor 2312, and the NMOS transistor 2314. The complementary input M is connected to the gates of the cross-coupled input transistor 2140, the PMOS transistor 2212, and the NMOS transistor 2214.

The first stage 3100 includes a PMOS transistor 3110 having a source connected to $V_{DD}$ and a NMOS transistor 3120 having a source connected to ground. The gates of the PMOS transistor 3110 and the NMOS transistor 3120 tied to the INPUT. The drains of the PMOS transistor 3110 and the NMOS transistor 3120 are connected together and outputs the INPUT_B. The second stage 3200 includes a PMOS transistor 3210 having a source connected to $V_{DD}$ and a NMOS transistor 3220 having a source connected to ground. The gates of the PMOS transistor 3210 and the NMOS transistor 3220 tied to the INPUT_B. The drains of the PMOS transistor 3210 and the NMOS transistor 3220 are connected together and output the following input N. The third stage 3300 includes a PMOS transistor 3310 having a source connected to $V_{DD}$ and a NMOS transistor 3320 having a source connected to ground. The gates of the PMOS transistor 3310 and the NMOS transistor 3320 tied to the following input N. The drains of the PMOS transistor 3310 and the NMOS transistor 3320 are connected together and output the complementary input M.

In an illustrative example, assume that the initial conditions are that following input N is 1 and complementary input M is 0. In this instance, K is 1 since K follows following input N in accordance with level shifter functionality. Consequently, cross-coupled input transistor 2130 is on, cross-coupled input transistor 2140 is off, XC NODE 2165 is 0, XC LEG 2160 is on (current flowing), cross-coupled source transistor 2120 is on, XC NODE 2155 is 1, XC LEG 2150 is off (current not flowing), and cross-coupled source transistor 2110 is off. Now assume that following input N switches to 0 and complementary input M switches to 1. Ideally, K should be 0 near immediately. However, until K reaches 0 due to the efforts of the cross-coupled input transistors 2130 and 2140 over the passage of settling time, conventional level shifters have no mechanisms to pull XC LEG 2160 or XC NODE 2165 high to turn off the cross-coupled source transistor 2120. At this time, the XC NODE 2165 is a high impedance node. Consequently, in the conventional level shifter the transition takes time and high-speed operability is impractical.

These shortcomings are overcome by operation of the sensing circuits 2200 and 2300 and with respect to the illustrative example, sensing circuit 2200. The threshold detector circuit 2210 senses when the complementary input M meets or exceeds a threshold voltage of the cross-coupled input transistor 2140. At this time, the pull-up node 2230 goes to 0 and XC LEG 2160 and XC NODE 2165 is pulled high. This results in cross-coupled source transistor 2120 being turned off, pushes K towards 0, and turns on cross-coupled source transistor 2110. This establishes two paths for providing current at the XC NODE 2165, one current path from the sensing circuit 2200 and another current path via the cross-coupled source transistor 2110. In effect, the XC NODE 2165 is being pre-charged or pre-set by the sensing circuit 2200 as the transition begins and enables high-speed operability. The resulting high-speed, low power level shifter circuit 2000 maintains low power usage and does not have transient current due to the cross-coupling during the transition.

Sensing circuit 2300 works the same as the sensing circuit 2200 when the initial conditions are that following input N is 0 and complementary input M is 1. In this instance, K is 0 since K follows following input N in accordance with level shifter functionality. Consequently, cross-coupled input transistor 2140 is on, cross-coupled input transistor 2130 is off, XC NODE 2155 is 0, XC LEG 2150 is on (current flowing), cross-coupled source transistor 2150 is on, XC NODE 2165 is 1, XC LEG 2160 is off (current not flowing), and cross-coupled source transistor 2120 is off. Now assume that following input N switches to 1 and complementary input M switches to 0. At this time, the XC NODE 2155 is a high impedance node.

The threshold detector circuit 2310 senses when the following input N meets or exceeds a threshold voltage of the cross-coupled input transistor 2130. At this time, the pull-up node 2330 goes to 0 and XC LEG 2150 and XC NODE 2155 is pulled high. This results in cross-coupled source transistor 2110 being turned off, pushes K towards 1, and turns on cross-coupled source transistor 2120. This establishes two paths for providing current at the XC NODE 2155, one current path from the sensing circuit 2300 and another current path via the cross-coupled source transistor 2120. In effect, the XC NODE 2155 is being pre-charged or pre-set by the sensing circuit 2300 as the transition begins and enables high-speed operability. The resulting high-speed, low power level shifter circuit 2000 maintains low power usage and does not have transient current due to the cross-coupling during the transition.

Figure 4:
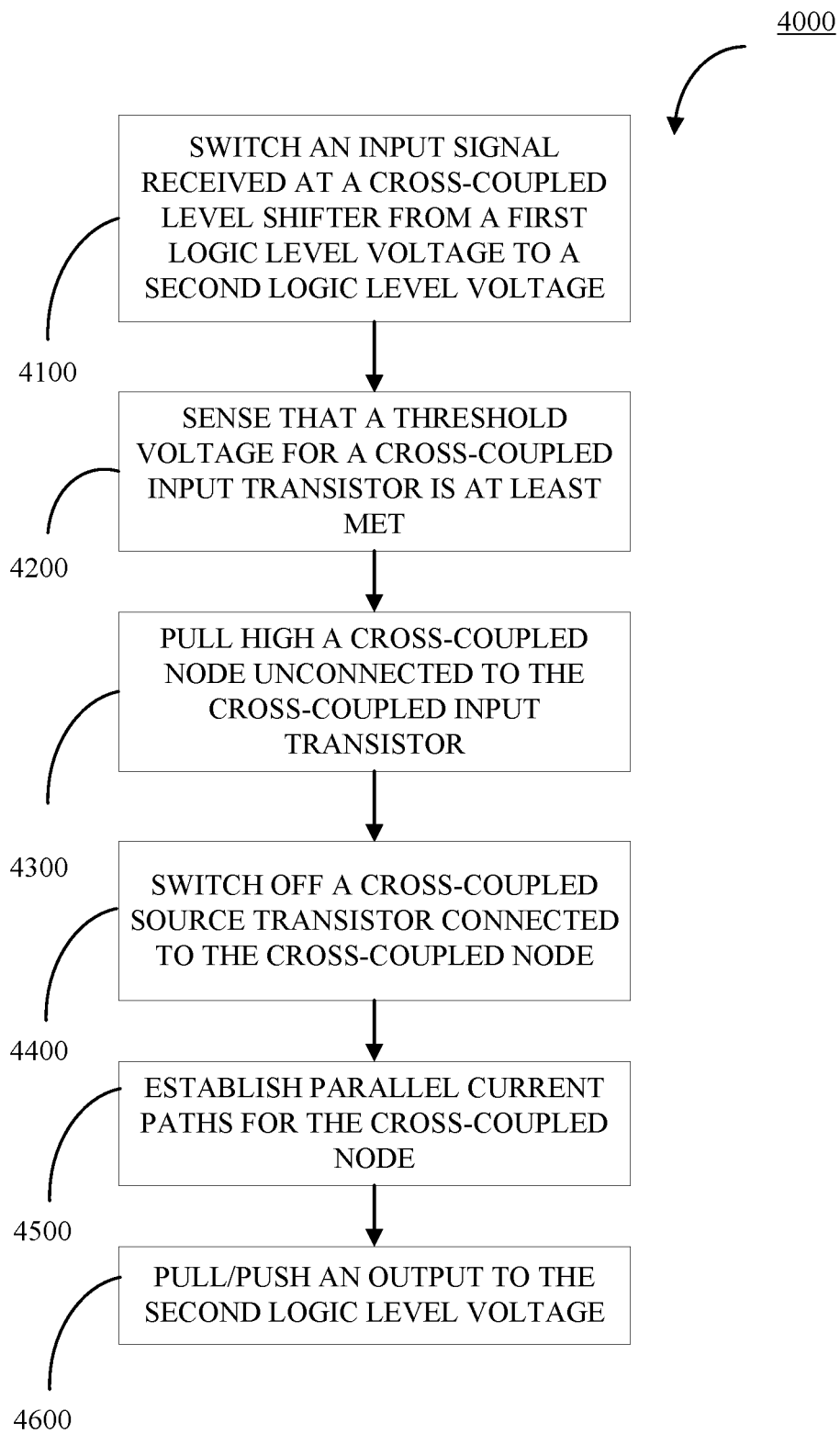
FIG. 4 is a diagram of an example technique for implementing cross-coupled high-speed, low power level shifting in accordance with embodiments of this disclosure.

FIG. 4 is a diagram of an example technique 4000 for implementing high-speed, low power level shifting in accordance with embodiments of this disclosure. The technique includes: switching 4100 an input signal received at a cross-coupled level shifter from a first logic level voltage to a second logic level voltage; sensing 4200 that a threshold voltage for a cross-coupled input transistor is at least met; pulling 4300 high a cross-coupled node unconnected to the cross-coupled input transistor; switching 4400 off a cross-coupled source transistor connected to the cross-coupled node; establishing 4500 parallel current paths for the cross-coupled node; and pulling/pushing 4600 an output to the second logic level voltage. The technique 4000 can be implemented, for example, in the high-speed, low power level shifter circuit 1000 of FIG. 1, the high-speed, low power level shifter circuit 2000 of FIG. 2, and like circuits, devices and systems.

The technique 4000 includes switching 4100 an input signal received at a cross-coupled level shifter from a first logic level voltage to a second logic level voltage. A cross-coupled level shifter includes a pair of cross-coupled input transistors, and a pair of cross-coupled source transistors connected by a pair of cross-coupled legs and via a pair of cross-coupled nodes.

The technique 4000 includes sensing 4200 that a threshold voltage for a cross-coupled input transistor is at least met. Each of the pair of cross-coupled input transistors and the pair of cross-coupled legs and the pair of cross-coupled nodes is connected to a respective sensing circuit. Each of the sensing circuits includes a voltage detector circuit tied to a respective cross-coupled input transistor.

The technique 4000 includes: pulling 4300 high a cross-coupled node unconnected to the cross-coupled input transistor. Each of the sensing circuits includes a pull-up circuit connected to the voltage detector circuit and to a respective cross-coupled node and cross-coupled leg.

The technique 4000 includes switching 4400 off a cross-coupled source transistor connected to the cross-coupled node. A respective pull-up circuit provides additional current to the cross-coupled node which turns off the cross-coupled source transistor.

The technique 4000 includes establishing 4500 parallel current paths for the cross-coupled node. The other cross-coupled source transistor is turned on, establishing a current path to the cross-coupled node. A second current path is provided by the pull-up circuit.

The technique 4000 includes pulling/pushing 4600 an output to the second logic level voltage. Causing the cross-coupled source transistor to turn off, stops transient current flow during the transition. The output is pulled to a voltage level representative of the second logic level voltage.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more computer readable mediums having computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A cross-coupled high-speed, low power level shifter circuit comprising:
   a cross-coupled level shifter circuit including a pair of input transistors, a pair of source transistors, a pair of cross-coupled legs connecting the pair of input transistors and the pair of source transistors, and a pair of cross-coupled nodes associated with the pair of cross-coupled legs; and
   a sensing circuit, the sensing circuit configured to:
      sense whether an input signal to an input transistor of the pair of input transistors crosses a threshold voltage; and
      pull-up a cross-coupled node of the pair of cross-coupled nodes when the threshold voltage is at least met, wherein the cross-coupled node is a high impedance node,
   wherein a source transistor of the pair of source transistors connected to the cross-coupled node is turned off and another source transistor of the pair of source transistors is turned on, establishing two current paths to the cross-coupled node and blocking off a transient current path, and
   wherein the sensing circuit includes at least one voltage detector comprising:
      a PMOS transistor; and
      a NMOS transistor connected to the PMOS transistor, wherein a gate of the PMOS transistor and a gate of the NMOS transistor is connected to the input signal.

2. The cross-coupled high-speed, low power level shifter circuit of claim 1, wherein each input transistor of the pair of input transistors is a n-type metal-oxide-semiconductor (NMOS) transistor.

3. The cross-coupled high-speed, low power level shifter circuit of claim 2, wherein each source transistor of the pair of source transistors is a p-type metal-oxide-semiconductor (PMOS) transistor.

4. The cross-coupled high-speed, low power level shifter circuit of claim 3, wherein the sensing circuit further comprises a pair of sensing circuits, each sensing circuit connected to one input transistor of the pair of input transistors and one cross-coupled node of the pair of cross-coupled legs.

5. The cross-coupled high-speed, low power level shifter circuit of claim 4, each sensing circuit further comprising:
   one of the at least one voltage detector; and
   a pull-up circuit connected to the one cross-coupled node of the pair of cross-coupled legs.

6. The cross-coupled high-speed, low power level shifter circuit of claim 5, further comprising:
   a buffer circuit connected to the output of the cross-coupled level shifter.

7. A device comprising:
   a cross-coupled level shifter; and
   a sensor connected to the cross-coupled level shifter, the sensor configured to:
      track whether an input signal to an input transistor of a pair of input transistors of the cross-coupled level shifter crosses a threshold voltage; and
      pull-up a high impedance node of the cross-coupled level shifter when the threshold voltage is crossed, wherein the high impedance node is one cross-coupled node of a pair of cross-coupled nodes associated with the pair of input transistors,
   wherein a source transistor associated with the high impedance node is turned off and another source transistor is turned on, establishing two current paths to the cross-coupled node and blocking off a transient current path,
   wherein the sensor includes at least one voltage detector comprising:
      a PMOS transistor; and
      a NMOS transistor connected to the PMOS transistor, wherein a gate of the PMOS transistor and a gate of the NMOS transistor is connected to the input signal; and
   wherein the source transistor and the another source transistor constitute a pair of source transistors for the cross-coupled level shifter.

8. The device claim 7, wherein the cross-coupled level shifter comprises:
   the pair of input transistors;
   the pair of source transistors, and
   a pair of cross-coupled legs connecting the pair of input transistors and the pair of source transistors, wherein the pair of cross-coupled nodes are associated with the pair of cross-coupled legs.

9. The device claim 8, wherein each input transistor of the pair of input transistors is a n-type metal-oxide-semiconductor (NMOS) transistor.

10. The device of claim 8, wherein each source transistor of the pair of source transistors is a p-type metal-oxide-semiconductor (PMOS) transistor.

11. The device of claim 8, wherein the sensor further comprises a pair of sensing circuits, each sensing circuit connected to one input transistor of the pair of input transistors and one cross-coupled node of the pair of cross-coupled nodes.

12. The device of claim 11, each sensing circuit further comprising:
   one of the at least one voltage detector; and
   a pull-up circuit connected to the one cross-coupled node of the pair of cross-coupled nodes.

13. The device of claim 8, further comprising:
   a buffer circuit connected to the output of the cross-coupled level shifter.

14. A method for cross-coupled level shifting, the method comprising:
- switching an input signal received at a cross-coupled level shifter from a first logic level voltage to a second logic level voltage;
- sensing that a threshold voltage for a cross-coupled input transistor of the cross-coupled level shifter is at least met;
- pulling high a cross-coupled node of the cross-coupled level shifter unconnected to the cross-coupled input transistor;
- switching off a cross-coupled source transistor connected to the cross-coupled node;
- establishing parallel current paths for the cross-coupled node unconnected to the cross-coupled input transistor; and
- pulling an output of the cross-coupled level shifter to a voltage level representative of the second logic level voltage,
- wherein the sensing further comprising:
  - coupling a n-type metal-oxide-semiconductor (NMOS) transistor to a p-type metal-oxide-semiconductor (PMOS) transistor and connecting gates of the NMOS transistor and the PMOS transistor to the input signal.

15. The method of claim 14, the method comprising:
- switching on another cross-coupled source transistor to establish the parallel current paths.

16. The method of claim 14, the method comprising:
- buffering the output to mitigate circuit loading.

17. The method of claim 14, the method comprising:
- coupling a pair of cross-coupled input transistors with a pair of cross-coupled source transistors via a pair of cross-coupled legs, wherein the pair of cross-coupled nodes are associated with the pair of cross-coupled legs.

18. The method of claim 17, wherein each cross-coupled input transistor of the pair of cross-coupled input transistors is a n-type metal-oxide-semiconductor (NMOS) transistor.

19. The method of claim 17, wherein each cross-coupled source transistor of the pair of cross-coupled source transistors is a p-type metal-oxide-semiconductor (PMOS) transistor.

* * * * *